United States Patent [19]

Metzger et al.

[11] Patent Number: 5,404,028
[45] Date of Patent: Apr. 4, 1995

[54] ELECTRICAL JUNCTION DEVICE WITH LIGHTLY DOPED BUFFER REGION TO PRECISELY LOCATE A P-N JUNCTION

[75] Inventors: Robert A. Metzger, Thousand Oaks; Madjid Hafizi, Santa Monica; William E. Stanchina; David B. Rensch, both of Thousand Oaks, all of Calif.

[73] Assignee: Hughes Aircraft Company, Los Angeles, Calif.

[21] Appl. No.: 7,705

[22] Filed: Jan. 22, 1993

[51] Int. Cl.[6] .................... H01L 29/161; H01L 29/72
[52] U.S. Cl. ...................... 257/15; 257/197; 257/565; 257/592; 257/653; 257/657
[58] Field of Search ................ 257/15, 183, 197, 198, 257/565, 591, 592, 607, 653, 655, 656, 657

[56] References Cited

U.S. PATENT DOCUMENTS 5,132,764  7/1992  Bayraktaroglu ................ 257/592

FOREIGN PATENT DOCUMENTS 504925  3/1993  European Pat. Off. .

OTHER PUBLICATIONS

Low-Temperature Characterization of High-Current-Gain Graded-Emitter AlGaAs/GaAs Narrow-Base Heterojunction Bipolar Transistor, K. Ikossi-Anastasiou et al, IEEE Electron Device Letters 13(1992) Aug., No. 8, New York, US.
Malik et al., "High-gain, high frequency AlGaAs/GaAs graded band-gap base bipolar transistors with a Be diffusion set back layer in the base", *Applied Physics Letters*, vol. 46, No. 6, pp. 600–602.
Jalali et al., "Near-ideal lateral scaling in abrupt AlInAs.InGaAs heterostructure bipolar transistors prepared by molecular beam epitaxy", *Applied Physics Letters*, vol. 54, No. 23, pp. 2333–2335.
Jensen et al., "AlInAs/GaInAs HBT Ic Technology", *IEEE Journal of Solid-State Circuits*, vol. 26, No. 3, pp. 415–421. Mar. 1991.
Nottenburg et al., "In P-Based Heterostructure Bipolar Transistor", Proc. of the 1989 GaAs IC Symposium, 1989, pp. 135–138.
Won et al., "Self-Aligned $In_{0.52}Al_{0.48}As/In_{0.53}Ga_{0.47}As$ Heterojunction Bipolar Transistors With Graded Interface on Semi-Insulating Inp Grown by Molecular Beam Epitaxy", *IEEE Electron Device Letters*, vol. 10, No. 3, Mar. 1989, pp. 138–140.
Asbeck et al., "In P-based Heterojunction Bipolar Transistors: Performance Status and Circuit Application", Second Int'l Conf. on Indium Phosphide and Related Materials, Apr. 23–25, 1990, pp. 2–5.
Capasso et al., "Pseudo-quaternary GaInAsP semiconductors A new $Ga_{0.47}In_{0.53}As/InP$ graded gap superlattice and its applications to avalance photodiodes", *Applied Physics Letters*, vol. 45, No. 11, 1 Dec. 1984, pp. 1193–1195.
Wada et al., "Very high speed GaInAs metal-semiconductor-metal photodiode incorporating an AlInAs/GaInAs graded superlattice", *Applied Physics Letters*, vol. 54, No. 1, 2 Jan. 1989, pp. 16–17.

Primary Examiner—Mark V. Prenty
Attorney, Agent, or Firm—V. D. Duraiswamy; W. K. Denson-Low

[57] ABSTRACT

An electrical junction is precisely located between a highly p doped semiconductor material and a more lightly n doped semiconductor material by providing a lightly p doped buffer region between the two materials, with a doping level on the order of the n doped material's. The buffer region is made wide enough to establish an electrical junction at approximately its interface with the n doped material, despite a diffusion of dopant from the p doped material. When applied to a heterojunction bipolar transistor (HBT), the transistor's base serves as the heavily p doped material and its emitter as the more lightly n doped material. The buffer region is preferably employed in conjunction with a graded superlattice, located between the buffer and emitter, which inhibits dopant diffusion from the base into the emitter. A p-n junction is formed within the superlattice, which functions on one side as an electrical extension of the emitter and on the other side as an electrical extension of the buffer, and establishes the electrical junction at the p-n junction location. The precise positioning of the electrical junction results in a known and repeatable emitter-base turn-on voltage.

20 Claims, 4 Drawing Sheets

| 1000Å | GaInAs CONTACT | n=1X10¹⁹ | — 34 |
|---|---|---|---|
| 700Å | AlInAs EMITTER CONTACT | n=1X10¹⁹ | — 32 |
| 1200Å | AlInAs EMITTER | n=8X10¹⁷ | — 30 |
| 300Å | GaInAs BASE BUFFER | p=2X10¹⁸ | — 28 |
| 500Å | GaInAs BASE | p=3X10¹⁹ | — 26 |
| 3000Å | GaInAs COLLECTOR | n=1X10¹⁶ | — 24 |
| 7000Å | GaInAs SUBCOLLECTOR | n=1X10¹⁹ | — 22 |
| 100Å | GaInAs BUFFER | UNDOPED | — 20 |
| | InP SUBSTRATE | | — 18 |

ELECTRICAL JUNCTION DEVICE WITH LIGHTLY DOPED BUFFER REGION TO PRECISELY LOCATE A P-N JUNCTION

BACKGROUND OF THE INVENTION

1. Field of the Invention

This invention relates to electrical junction devices that are subject to a p dopant diffusion from a heavily p doped region to a more lightly n doped region, and to structures for inhibiting such diffusion.

2. Description of the Related Art

A heterojunction bipolar transistor (HBT) is an example of an electrical junction device that has a highly p doped region from which dopant can diffuse into a nearby more lightly doped n region. Other devices that have such p-n junctions include zener diodes, tunneling diodes, and lasers with an interface between a heavily p doped cladding layer and a more lightly n doped or even intrinsic active region. However, since the development of the present invention has occurred in connection with HBTs, in which a diffusion of a p base dopant to the n doped emitter region is a particular problem, the following discussion will be in terms of this type of device.

HBTs represent a field of increasing interest because of their potential for higher emitter efficiency, decreased base resistance, less emitter current crowding, improved frequency response and wider temperature range of operation. A representative HBT is illustrated in FIG. 1. It includes a semi-insulating semiconductor substrate 2, typically InP or GaAs. A highly doped n+ subcollector layer 4 on the substrate provides an underlying contact with the more lightly n− doped collector layer 6, with a metallized or highly doped semiconductor pad 8 providing a collector contact through the subcollector. A p+ base layer 10 is formed over the collector, with an n doped emitter 12 over the central portion of the base, and a lateral base contact 14 surrounding the emitter. An emitter contact 16 is provided on the emitter's upper surface.

During the operation of the HBT, the input voltage forward-biases the base-emitter junction, allowing electrons from the n-type emitter to enter the base. The injected electrons travel across the base by diffusion or drift, and are swept into the collector when they reach the base-collector junction by the high fields in this region. In a homojunction bipolar transistor there is a flow of holes from the base into the emitter across the forward biased base-emitter junction. To suppress the reverse hole injection, the base doping is made lower than that of the emitter. This, however, makes the base layer more resistive, thereby increasing the device's overall base resistance and degrading its bandwidth. In an HBT, by contrast, a wide-bandgap emitter material is used that creates a higher energy barrier for hole injection into the emitter than the barrier to electron flow into the base, thereby automatically suppressing the base current that is due to hole injection. The doping of the base layer can be made as large as possible from solid state chemistry considerations, and the base resistance is correspondingly reduced.

To achieve the high base dopings necessary for RF performance, typically $5-10 \times 10^{19}$ cm$^{-3}$ beryllium is widely used as the p type base dopant for npn HBTs. A significant reliability issue with such devices is that the electric currents and fields generated at the base-emitter junction cause Be to diffuse from the base into the emitter. This movement of Be is characterized by an increase in the emitter-base turn-on voltage as the electrical junction (defined as the location where the dopant concentration of Be equals the n dopant concentration of the emitter) is pushed further into the emitter. The Be penetration leads to a reduction in gain, and eventually to complete failure of the transistor. This degradation mechanism is currently the operating rate limiting failure mechanism of npn AlInAs/GaInAs HBTs.

The large variability in turn-on voltage is a result of this voltage's dependence upon the bandgap energy at the electrical junction location. This can be expressed as:

$$V_{eb} \alpha Eg/q + K\ln(Ic),$$

where $V_{eb}$ is the emitter-base turn-on voltage, Eg is the bandgap energy at the electrical junction, q is the electron charge, K is a constant, in is the natural logarithm function and Ic is the HBT's collector current. The position of the electrical junction is established at the point where the n-dopant concentration in the wide bandgap emitter (typically silicon) equals the p-type Be dopant concentration in the narrow bandgap base.

For the example of an AlInAs/GaInAs emitter/base junction, the bandgap energy of AlInAs is 1.45 ev, while that of GaInAs is 0.75 ev. If the electrical junction moves from the more heavily p-doped GaInAs base into the n-doped AlInAs emitter due to Be diffusion, the device's turn-on voltage will increase in proportion to the difference between the bandgap energies of the emitter and base materials, which in this case would be about 700 mV. For some applications such as analog-to-digital converters (ADCs), by contrast, it is desirable for the emitter-base turn-on voltage to be controlled to a level of a few mV. For an abrupt emitter-base junction, a movement of the electrical junction by only tens of Angstroms can shift the junction position out of the base and into the emitter, resulting in significant turn-on voltage changes on the order of hundreds of mV.

In a typical HBT, the base doping concentration is 1-2 orders of magnitude higher than the emitter doping concentration. Be is typically used as the base dopant. It diffuses rapidly, with a concentration-dependent diffusion constant that increases at higher doping levels and can exhibit "explosive" degrees of diffusion when a sufficiently high level of doping (greater than $10^{19}$ cm$^{-3}$) is attempted. Therefore, the electrical junction is typically determined by Be diffusion into the emitter. This results in a very nonreproducible junction position from wafer to wafer, and even at different locations on a single wafer, since the Be diffusion from the heavily doped base is very sensitive to wafer temperature during growth. In addition, if different base dopings are required, the different Be doping levels will diffuse to different degrees, and this in turn will result in different positionings of the electrical junction.

One approach to solving the Be diffusion problem uses an undoped layer of low bandgap material, such as GaInAs or GaAs about 100-500 Angstroms thick, between the wide band-gap emitter and the low bandgap base. The undoped layer acts as a buffer region into which the base Be can diffuse, so that the bulk of the diffusing Be does not reach the emitter. This technique is described in Malik et al., "High-gain, high frequency AlGaAs/GaAs graded band-gap base bipolar transistors with a Be diffusion set back layer in the base" *Ap-* plied *Physics Letters*, Vol. 46, No. 6, pages 600–602, (1985), and in Jalali et al., "New ideal lateral scaling in abrupt AlInAs.InGaAs heterostructure bipolar transistors prepared by molecular beam epitaxy" *Applied Physics Letters*, Vol. 54, No. 23, pages 2333–2335, (1989). Undoped setback or spacer layers of base material between the base and emitter are also disclosed in Jensen et al., "AlInAs/GaInAs HBT Ic Technology", *IEEE Journal of Solid-State Circuits*, Vol. 26, No. 3, March 1991, pages 415–421, and in Nottenburg et al., "In P-Based Heterostructure Bipolar Transistors", *Proc of the 1989 GaAs IC Symposium*, 1989, pages 135–138.

When using the setback approach, some of the Be must still diffuse into the wide bandgap emitter, or the resulting undoped region between the emitter and base can result in gain degradation and increased base resistance. This approach does reduce the actual amount of Be that diffuses into the emitter, but the positioning of the emitter-base electrical junction is still dependent upon how far the Be diffuses into the emitter, and control of the emitter-base turn-on voltage is quite poor. An additional complication is that different base doping levels will result in different degrees of Be penetration into the emitter.

Another approach has been to replace the abrupt heterointerface at the emitter-base junction with a region in which the alloy is graded between the emitter and base materials. In Won et al, "Self-Aligned $In_{0.52}Al_{0.48}As/In_{0.53}Ga_{0.47}$ As Heterojunction Bipolar Transistors with Graded Interface on Semi-Insulating InP Grown by Molecular Beam Epitaxy", *IEEE Electron Device Letters*, Vol. 10, No. 3, March 1989, pages 138–140, a graded interface is provided between the base and emitter that makes a linear and continuous transition from the base to the emitter material. In Asbeck et al., "InP-based Heterojunction Bipolar Transistors: Performance Status and Circuit Applications", *Second Int'l Conf. on Indium Phosphide and Related Materials*, Apr. 23–25, 1990, pages 2–5, a short period superlattice is formed between an AlInAs emitter and a GaInAs base. The superlattice consists of four sections, with each section having four identical periods; each period had a thickness of 12 Angstroms. The ratio of the width of emitter material to the width of base material in each superlattice period varied from about 4:1 in the section adjacent the emitter, to about 1:4 in the section adjacent the base. This structure was proposed as an alternate to a continuously graded interface because of the latter's fabrication difficulties.

Continuously graded junctions of the Won et al. type have been used to avoid conduction spikes at the emitter-base junction, and to thus enhance charge transport and current gain, but they do not solve the Be diffusion problem. The advantage of the approach is that the bandgap slowly changes over several hundred Angstroms, instead of abruptly changing over tens of Angstroms. Since the change in $V_{eb}$ is proportional to the change in bandgap, for a given amount of diffusion $V_{eb}$ will change much less for a graded than for an abrupt junction. However, even though the Won et al. method lessens the sensitivity of $V_{eb}$ to Be diffusion, it is still the diffusion of the Be from the heavily doped base that determines the position of the emitter-base electrical junction. In the Asbeck et al. superlattice structure, no reduction in field-enhanced diffusion of Be from the base was noted.

Graded superlattices between p and n doped regions have previously been used in contexts other than HBTs. A graded superlattice was employed to eliminate the interface pile-up effect of holes in a "high-low" InP/GaInAs avalanche photodiode in Capasso et al., "Psuedo-quaternary GaInAsP semiconductors: A new $Ga_{0.47}In_{0.53}As/InP$ graded gap superlattice and its applications to avalanche photodiodes", *Applied Physics Letters*, Vol. 45, No. 11, Dec. 1, 1984, pages 1193–1195, and to minimize the effect of carrier trapping at the AlInAs/GaInAs interface of a metal-semi-conductor-metal photodiode in Wada et al., "Very high speed GaInAs metal-semiconductor-metal photodiode incorporating an AlInAs/GaInAs graded superlattice", *Applied Physics Letters*, Vol. 54, No. 1, Jan. 2, 1989, pages 16–17. Neither of these structure purported to block a diffusion of p dopant into an n doped region.

SUMMARY OF THE INVENTION

The present invention seeks to provide an electrical junction device with a heavily p doped semiconductor material that forms a junction with a more lightly n doped or intrinsic semiconductor material, in which the electrical junction is determined by the device geometry and not by the diffusion of p dopant into the n doped material.

This goal is accomplished by the provision of a buffer layer between the heavily p doped and the more lightly n doped (or intrinsic) material, with the buffer layer's dopant concentration substantially closer to that of the non-p doped material than to that of the p doped material. In the absence of the buffer layer, the doping concentration of the p material is high enough to give at least a portion of the n doped (or intrinsic) material a net p doping through dopant diffusion across a direct contact between the materials. The buffer layer is wide enough so that the concentration of diffused dopant from the p doped material does not exceed the doping concentration of the n doped material at the interface between the buffer and the n doped material, thereby establishing the electrical junction at approximately the interface location.

The invention can be implemented as an HBT, with the p doped and n doped materials respectively forming the device's base and emitter, and the buffer serving in effect as a second base stage. The HBT also preferably includes a graded superlattice between the buffer layer and emitter. The superlattice has multiple discrete periods, with each period having a layer of the buffer material and a layer of the emitter material; the thicknesses of the base material layers decrease while the thicknesses of the emitter material layers increase in discrete steps for successive periods from the buffer to the emitter. A doping is provided to establish the electrical junction within the superlattice, with the superlattice periods on the buffer side of the junction doped p at approximately the buffer dopant concentration, and the superlattice periods on the emitter side of the junction doped n at approximately the emitter dopant concentration. This provides additional resistance to any movement of the electrical junction, and minimizes the effects of any such movement upon the device's emitter-base turn-on voltage.

These and other features and advantages of the invention will be apparent to those skilled in the art from the following detailed description, taken together with the accompanying drawings.

DETAILED DESCRIPTION OF THE INVENTION

The present invention will be described in terms of an HBT with an AlInAs emitter and a GaInAs base. However, it should be understood that it is applicable in general to electrical junction devices in which a p doped region has a significantly higher doping level than an adjacent n doped or intrinsic semiconductor region, and in which the p dopant tends to diffuse into the other region to move the electrical junction between the two, such as the semiconductor lasers, zener diodes and tunneling diodes referred to previously. Also, in the context of an npn HBT, the invention is applicable to other emitter/base combinations, such as AlGaAs/GaAs, GaAs/GaInP and InP/GaInAs. The enhanced ability and reliability achieved with the invention make it applicable to any HBT in which a control of the emitter-base turn-on voltage is important, but it is particularly applicable to analog-to-digital converters (ADCs) and digital-to-analog converters (DACs), in which control on the order of millivolts is required. In addition, since the diffusion of the Be dopant is a kinetically activated process that is greatly accelerated at higher temperatures, enhanced reliability and stability are even more important to achieve in hot environments (100°–200° C.) such as those found in automobile engine compartments.

The present invention divides the base into two sections: the main base with the usual high doping level, and a buffer region between the main base and emitter with a much lower p doping, on the order of the emitter's n doping concentration. The base's high doping level offers the high conductivity and low sheet resistance required for fast RF operation of the HBT, while the lightly doped buffer region precisely defines the location of the emitter-base electrical junction.

Figures 1, 2:
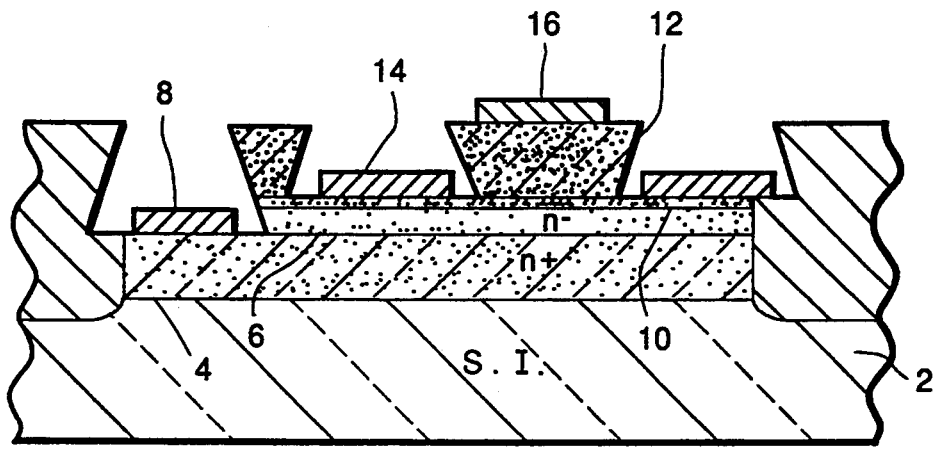
FIG. 1 is a sectional view, described above, of a conventional HBT.
FIG. 2 is a material diagram of a basic HBT in accordance with the invention.

An example of an HBT fabricated in accordance with the invention is shown in FIG. 2. The device is preferably formed by MBE on an InP substrate 18, with a 100 Angstrom GaInAs undoped buffer layer 20 over the substrate and then in succession a 7,000 Angstrom GaInAs subcollector layer 22 with an n doping of $1 \times 10^{19}$ cm$^{-3}$, a 3,000 Angstrom GaInAs collector layer 24 with an n doping concentration of $1 \times 10^{16}$ cm$^{-3}$, and a 500 Angstrom GaInAs base layer 26 with a p doping concentration of $3 \times 10^{19}$ cm$^{-3}$.

A GaInAs base buffer layer 28 is grown on top of the main base layer 26, with a p dopant level that is significantly less than that of the main base. The buffer width is selected so that, given the doping level for the main base, the concentration of dopant diffusion from the base falls below the n dopant concentration of an emitter layer 30 at a location within the buffer, or right at the buffer/emitter interface. This ensures that the electrical emitter-base junction occurs at the buffer-emitter interface; this precise location for the electrical junction, independent of dopant diffusion from the base, results in a predictable and repeatable emitter-base turn-on voltage. In the illustration given, the buffer width is 300 Angstroms, and its p doping level is $2 \times 10^{18}$ cm$^{-3}$.

The emitter 30 that is formed over the buffer has an n dopant concentration of $8 \times 10^{17}$ cm$^{-3}$, and is formed from AlInAs 1,200 Angstroms thick. To complete the transistor structure, a 700 Angstrom AlInAs emitter contact layer 32 with an n doping level of $1 \times 10^{19}$ cm$^{-3}$ is formed over the emitter 30, followed by a 1,000 Angstrom GaInAs contact layer 34, which has the same n doping level as the emitter contact layer 32.

Be is a common dopant with MBE grown HBTs, but the invention is also applicable to other p-type base dopants such as carbon. It is also applicable to HBTs formed by metal oxide chemical vapor deposition (MOCVD) with p-type dopants such as Zn, Mn and Mg. Although the buffer layer 28 is conveniently formed from the same material as the base layer 26, this is not essential, so long as these two layers are reasonably lattice matched. Examples of different material combinations that could be used for the base and buffer are GaAs for the base and GaInP for the buffer (with a AlGaAs emitter), or GaInAs for the base and AlInAs for the buffer (with an InP emitter). If desired, the base and buffer materials in the above examples could be switched.

Different dopants could also be used for the base and buffer layers. For example, the base could be doped with Be and the buffer with carbon. While carbon exhibits a lower degree of diffusion than does Be, it is more difficult to activate. However, activating the buffer region is considerably less important than activating the main base.

It is important that the doping level for the buffer layer 28 be substantially less than that of the base 26, on the order of the emitter's doping level. This causes the device's electrical junction to be formed at or very close to the emitter-buffer interface. It is permissible for the buffer doping level to be somewhat higher or lower than that of the emitter, although in that case there may be a small amount of dopant diffusion from the higher into the lower doped layer, with a consequent slight shifting of the electrical junction. In general, the degree of precision in being able to fix the junction location will vary with the closeness of the buffer and emitter doping levels to each other.

Figure 3:
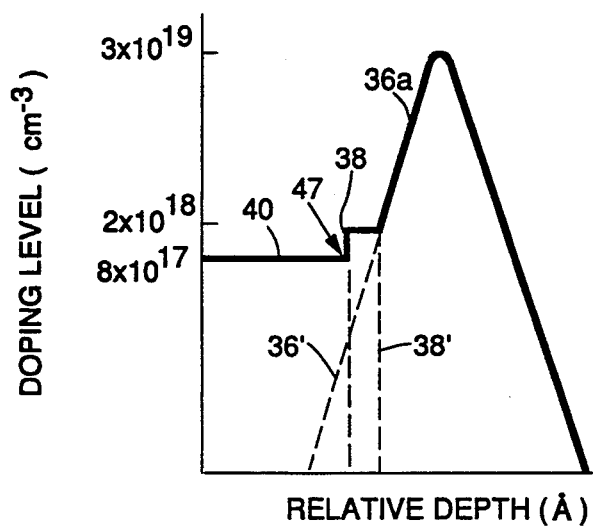
FIGS. 3a, 3b and 3c are graphs illustrating the doping profile for an HBT with a lightly doped base buffer layer, for three different depths of base dopant diffusion.
Figure 3:
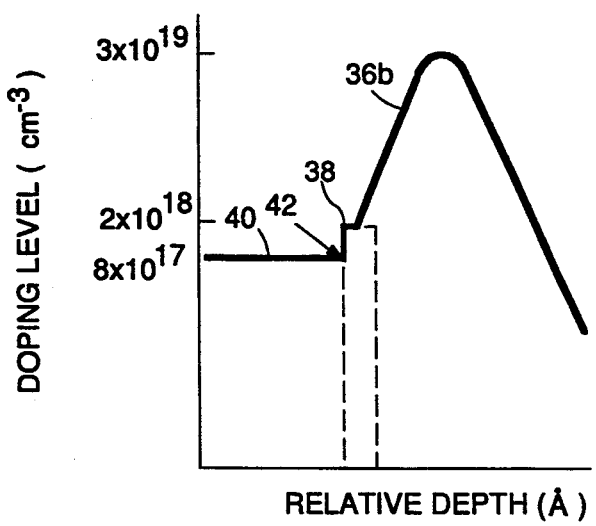
Figure 3:
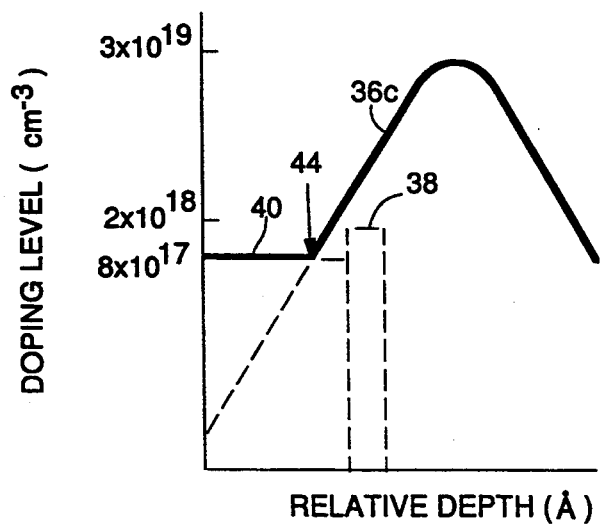

FIGS. 3a–3c illustrate the electrical junction location for various degrees of base dopant diffusion. In FIG. 3a, the base dopant concentration is given by curve 36a, while the buffer dopant concentration is given by step 38 and the emitter dopant concentration by step 40. The base dopant concentration follows a generally Gaussian curve; in practice the buffer dopant level would also follow a Gaussian curve, but it is shown as a uniform dopant level for ease of illustration. The limits of the buffer region are indicated by dashed lines 38', while an extension of the base dopant profile is indicated by dashed line 36a'. As can be seen from the figure, the base dopant has undergone little or no diffusion; the electrical junction at which the p dopant level matches the n dopant level is precisely located at the buffer/emitter interface 42. However, since the base dopant level falls below that of the buffer layer at a location well removed from the buffer/emitter junction, the buffer layer could be made considerably thinner.

FIG. 3b illustrates the optimum situation, in which the buffer layer is just wide enough to establish the electrical junction at the buffer/emitter interface, but no wider. In this example, the base dopant 36b exhibits a greater diffusion into the buffer layer than in FIG. 3a, and just equals the emitter doping level at the buffer/emitter interface 42. The electrical junction is thus still precisely located at this interface, but the buffer layer is no thicker than necessary.

FIG. 3c illustrates the case in which the base dopant 36c has diffused so far past the buffer layer that its concentration exceeds that of the emitter doping at the buffer/emitter interface. In this situation the electrical junction is shifted into the emitter to location 44, where the diffused dopant concentration from the base just equals the emitter doping level. The width of the buffer layer 38 is thus inadequate, and any slight movement of the diffused base dopant will change the location of the electrical junction, which in turn will alter the emitter-base turn-on voltage.

Figure 4:
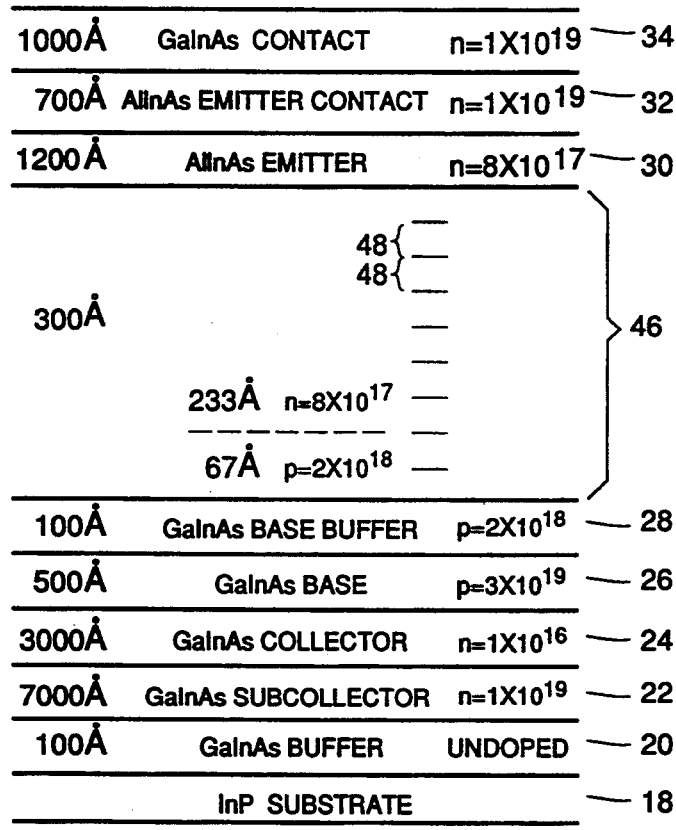
FIGS. 4 and 5 are material diagrams of two HBT structures which include base buffer layers together with a doped superlattice between the base and emitter, for two different electrical junction positions within the superlattice.
Figure 5:
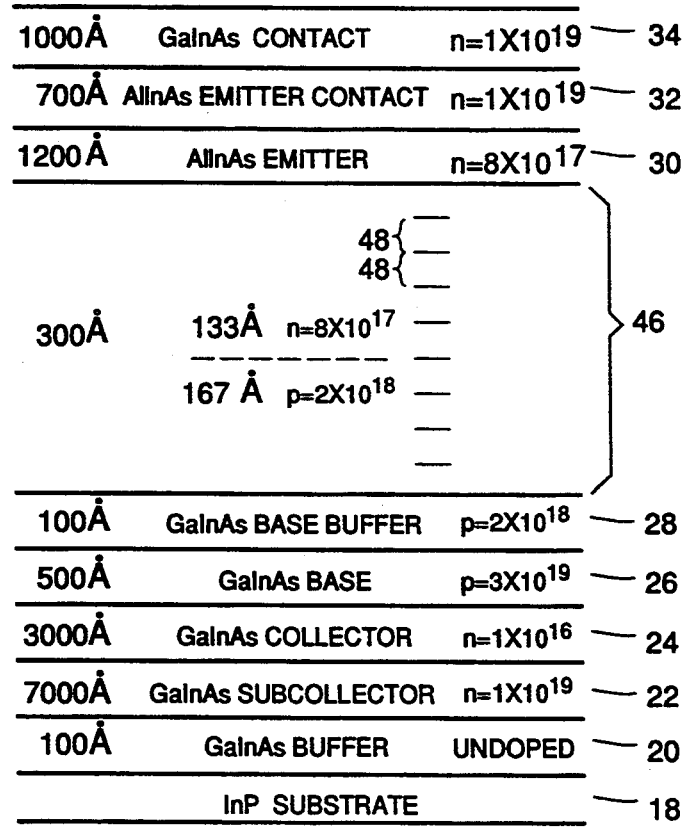

A precise positioning of the electrical junction can thus be achieved either by making the doped buffer layer wide enough for a given amount of base dopant diffusion, by restricting the amount of diffusion for a given buffer width, or both. In general, a narrow buffer width is preferred because the buffer represents a higher resistivity level than the main base. A structure that restricts the base diffusion, and thus allows for a narrow buffer, is shown in FIGS. 4 and 5. It is similar to the HBT of FIG. 2, with common elements identified by the same reference numerals. However, a graded superlattice 46 is inserted between the buffer layer 28 and the emitter 30. As taught in copending application Ser. No. 08/007,695 by Metzger et al., "Gain-Stable NPN Heterojunction Bipolar Transistor", filed on the same day as the present application and also assigned to Hughes Aircraft Company, the superlattice 46 effectively prevents the base dopant from diffusing into the emitter while under operation. Its use together with the buffer layer 28 has been found to be particularly effective in restricting the electrical junction to a desired location.

The illustrated superlattice consists of multiple successive periods 48, with each period including a layer of buffer material and a layer of emitter material. The periods most conveniently have equal thicknesses, but this is not essential. More than five periods are preferred; nine periods are used in the examples of FIGS. 4 and 5. Beginning from the side of the superlattice adjacent the buffer layer, the first period has a very thin layer of emitter material and a much thicker layer of buffer material. The thicknesses of the two layers are altered in discrete steps for each successive period, with the thickness of the emitter material progressively increasing and that of the buffer material progressively decreasing. By the time the last period 48 is reached, adjacent to the emitter, the layer of buffer material is very thin and the layer of emitter material is much thicker. Each period is illustrated as being 33.3 Angstroms thick. Beginning again at the first period on the buffer side of the superlattice, the first layer of buffer material is 30.0 Angstroms thick, while the first layer of emitter material is 3.3 Angstroms thick. The thicknesses of the buffer material layers drop in approximately 3.3 Angstrom steps for each successive period, while the thicknesses of the emitter material layers increase by the same amount. Thus, the second and third periods from the buffer will have buffer material layers of 26.6 and 23.3 Angstroms and emitter material layers of 6.7 and 10.0 Angstroms, respectively, while the superlattice period nearest the emitter has a 3.3 Angstrom buffer material layer and a 30.0 Angstrom emitter material layer.

The electrical junction is precisely located within the superlattice by doping the periods on the emitter side of the superlattice n-type at a doping level similar to that of the emitter, and doping the periods on the buffer side of the superlattice p-type at a doping level similar to that of the buffer. The n and p doped superlattice periods thus function electrically essentially as extensions of the emitter and buffer, respectively.

In the FIG. 4 example, the thickness of the buffer layer 28 has been reduced to 100 Angstroms and the two adjacent superlattice periods are doped p-type and extend 67 Angstroms into the superlattice, while the remaining periods are doped n-type and have an aggregate thickness of 233 Angstroms. The structure of the FIG. 5 example is the same, but the p-doping of the superlattice has been extended to five periods for a depth of 167 Angstroms, with the remaining four periods doped n-type.

Figure 6:
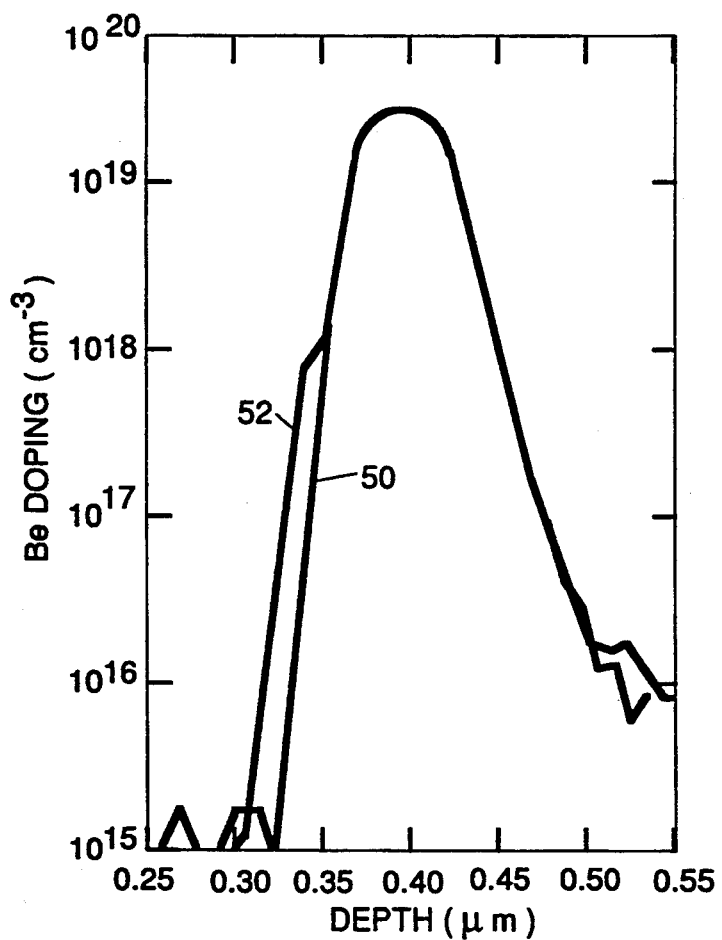
FIG. 6 is a graph showing the doping profiles for the HBTs of FIGS. 4 and 5.

In a demonstration of the invention, the base layers of the HBTs shown in FIGS. 4 and 5 were grown by MBE at a low temperature of 300° C. with a Be dopant. This low growth temperature has been found to inhibit the diffusion of Be out of the base during its fabrication, as described in copending patent application Ser. No. 08/007,427 by Metzger et al., "Heterojunction Bipolar Transistor Fabrication Method With Low Temperature Base Growth", filed on the same day as the present application and also assigned to Hughes Aircraft Company. Any Be diffusion in the HBTs of FIGS. 4 and 5 could therefore be attributed to the operation of the device, rather than to its fabrication. The devices were operated with zero collector-base voltages and one volt collector-emitter voltages. Secondary ion mass spectroscopy (SIMS) was performed on the two samples to examine the Be profile. The results are shown in FIG. 6, in which the depth scale is measured with respect to the top of the contact layer 34. Curves 50 and 52 display the measurements obtained for the devices of FIGS. 4 and 5, respectively. As these curves show, the FIG. 4 device (curve 50) exhibits an almost perfect Gaussian profile, thereby obscuring the buffer region. However, curve 52 for the FIG. 5 device clearly shows the buffer region with its $2 \times 10^{18}$ cm$^{-3}$ doping level, evidencing that the Be from the heavily doped base did not significantly diffuse beyond the buffer (as extended by the p doped portion of the superlattice).

Curve 52 closely resembles the doping profile illustrated in FIG. 3a. By contrast, an analysis of the SIMS profile showed that the Be from the heavily doped base of the FIG. 4 sample (curve 50) just diffused to the far edge of the buffer layer (as extended by the p doped portion of the superlattice), in a manner very similar to that illustrated in FIG. 3b. This demonstration showed that, for the HBT structure and doping levels of FIGS. 4 and 5, the buffer region must extend at least 67 Angstroms into the superlattice to accurately define the location of the electrical junction. If the p-n junction were formed within the superlattice any closer to the base, the electrical junction would instead be defined by dopant diffusion from the heavily doped base.

Figure 7:
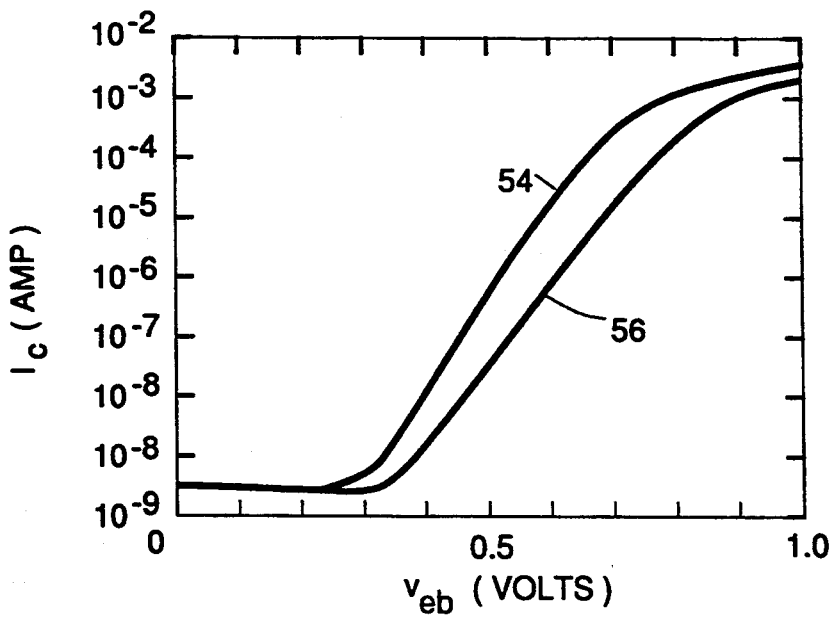
FIG. 7 is graph showing the emitter-base turn-on voltages for the HBTs of FIGS. 4 and 5.

To demonstrate that it is the extension of the buffer layer into the superlattice that determines the location of the electrical junction, rather than base dopant diffusion, the collector currents $I_c$ of the HBTs were measured as a function of the emitter-base voltage $V_{eb}$. The results are shown by curves 54 and 56 in FIG. 7 for the devices of FIGS. 4 and 5, respectively. The FIG. 5 device exhibited a higher emitter-base turn-on voltage (by approximately 100 mV), reflecting a positioning of the electrical junction further into the superlattice from the base. It was thus shown that the use of a lightly doped buffer, in conjunction with a graded superlattice, permits an HBT to be accurately and reliably designed for a desired emitter-base turn-on voltage by extending the buffer doping to a desired location within the superlattice, independent of dopant diffusion from the heavily doped base.

While particular illustrative embodiments of the invention have been shown and described, numerous variations and alternate embodiments will occur those skilled in the art. Such variations and alternate embodiments are contemplated, and can be made without departing from the spirit and scope of the invention as defined in the appended claims.

We claim:

1. An electrical junction device, comprising:
   a p doped semiconductor material,
   an n doped semiconductor material,
   a p doped semiconductor buffer interfacing with said p doped material, said buffer having a substantially lower p dopant concentration than said p doped material,
   a graded superlattice between said buffer and said n doped material, said superlattice comprising multiple discrete periods with each period having a layer of the buffer material and a layer of the n doped material, the thicknesses of said buffer material layers decreasing and the thicknesses of said n doped material layers increasing in discrete steps for successive periods from the buffer to the n doped material, the periods on the n doped material side of the superlattice being n doped at approximately the dopant concentration of said n doped material and the periods on the buffer side of the superlattice being p doped at approximately the dopant concentration of the buffer so that the n and p doped periods function electrically as extensions of the n doped material and buffer respectively so that an electrical junction is located within said superlattice, and
   means for applying an electrical signal to said p doped and n doped materials.

2. The electrical junction device of claim 1, said device comprising a heterojunction bipolar transistor (HBT), said p doped and n doped materials respectively comprising the base and emitter of said HBT.

3. The HBT of claim 2, further comprising an n doped semiconductor collector, wherein said graded superlattice is on one side of said base between said buffer and said emitter and said collector is on the other side of said p doped base.

4. The electrical junction device of claim 1, wherein said p doped material and said buffer are doped with the same type of dopant.

5. The electrical junction device of claim 1, wherein said p doped material and said buffer are doped with different types of p dopant atoms.

6. The electrical junction device of claim 1, wherein said p doped material is doped with beryllium.

7. The electrical junction device of claim 1, wherein said p doped material and said buffer are formed from the same type of material.

8. The electrical junction device of claim 1, wherein said p doped material and said buffer are formed from different types of material.

9. An electrical junction device, comprising:
   a p doped semiconductor material,
   an n doped semiconductor material with a dopant concentration substantially less than that of the p doped material,
   a p doped semiconductor buffer interfacing with said p doped material, said buffer having a dopant concentration that is substantially less than that of the p doped material, and substantially closer to the dopant concentration of said n doped material than to that of the p doped material,
   a graded superlattice between said buffer and said n doped material, said superlattice comprising multiple discrete periods with each period having a layer of the buffer material and a layer of the n doped material, the thicknesses of said buffer material layers decreasing and the thicknesses of said n doped material layers increasing in discrete steps for successive periods from the buffer to the n doped material, and
   means for applying an electrical signal to said p doped and n doped materials.

10. The electrical junction device of claim 9, said device comprising a heterojunction bipolar transistor (HBT), said p doped and n doped materials respectively comprising the base and emitter of said HBT.

11. The HBT of claim 10, further comprising an n doped semiconductor collector on one side of said p doped base, and wherein said graded superlattice is on the other side of said base between said buffer and said emitter, and is doped to establish an electrical junction within the superlattice, with the superlattice periods on the buffer side of the junction doped p at approximately the buffer dopant concentration and electrically functioning as an extension of said buffer, and the superlattice periods on the emitter side of the junction doped n at approximately the emitter dopant concentration and electrically functioning as an extension of said emitter.

12. The electrical junction device of claim 9, wherein said p doped material is doped with beryllium.

13. An electrical junction device, comprising:
   a p doped semiconductor material,
   an n doped semiconductor material,
   a p doped semiconductor buffer interfacing with said p doped material with a dopant concentration substantially less than that of the p doped material,
   a graded superlattice between said buffer and said n doped material, said superlattice comprising multiple discrete periods with each period having a layer of the buffer material and a layer of the n doped material, the thicknesses of said buffer material layers decreasing and the thicknesses of said n doped material layers increasing in discrete steps for successive periods from the buffer to the n doped material, and
   means for applying an electrical signal to said p and n doped materials, the doping concentration of said p doped material being great enough to provide at least a portion of said n doped material with a net p doping by dopant diffusion across a direct contact between said materials, said buffer being wide enough so that the concentration of diffused dopant from said p doped material does not exceed the doping concentration of said n doped material at the interface between said buffer and said n doped material.

14. The electrical junction device of claim 13, said device comprising a heterojunction bipolar transistor (HBT), said p doped and n doped materials respectively comprising the base and emitter said HBT.

15. The HBT of claim 14, further comprising an n doped semiconductor collector, wherein said graded superlattice is on one side of said base between said buffer and said emitter and said collector is on the other side of said p doped base, and said graded superlattice is doped to establish an electrical junction within the superlattice, with the superlattice periods on the buffer side of the junction doped p at approximately the buffer dopant concentration and electrically functioning as an extension of said buffer, and the superlattice periods on the emitter side of the junction doped n at approximately the emitter dopant concentration and electrically functioning as an extension of said emitter.

16. The electrical junction device of claim 13, wherein said p doped material is doped with beryllium.

17. An electrical junction device, comprising:
a p doped semiconductor material,
an n doped semiconductor material,
a p doped semiconductor buffer interfacing said p doped material with a dopant concentration substantially less than that of the p doped material,
a graded superlattice between said buffer and said n doped material, said superlattice comprising multiple discrete periods with each period having a layer of the buffer material and a layer of the n doped material, the thicknesses of said buffer material layers decreasing and the thicknesses of said n doped material layers increasing in discrete steps for successive periods from the buffer to the n doped material, and
means for applying an electrical signal to said p doped and n doped materials,
the doping concentration of said p doped material being great enough to provide at least a portion of said n doped material with a net p doping by dopant diffusion across a direct contact between said materials, said buffer being wide enough so that the concentration of diffused dopant from said p doped material does not exceed the p doping concentration of said buffer at the interface between said buffer and said n doped material.

18. The electrical junction device of claim 17, said device comprising a heterojunction bipolar transistor (HBT), said p doped and n doped materials respectively comprising the base and emitter said HBT.

19. The HBT of claim 18, further comprising an n doped semiconductor collector, wherein said graded superlattice is on one side of said base between said buffer and said emitter and said collector is on the other side of said base, and said graded superlattice is doped to establish an electrical junction within the superlattice, with the superlattice periods on the buffer side of the junction doped p at approximately the buffer dopant concentration and electrically functioning as an extension of said buffer, and the superlattice periods on the emitter side of the junction doped n at approximately the emitter dopant concentration and electrically functioning as an extension of said emitter.

20. The electrical junction device of claim 17, wherein said p doped material is doped with beryllium.

* * * * *